(12) United States Patent
Hertzberg et al.

(10) Patent No.: US 10,445,651 B2
(45) Date of Patent: *Oct. 15, 2019

(54) VERTICAL SUPERCONDUCTING CAPACITORS FOR TRANSMON QUBITS

(71) Applicant: International Business Machines Corporation, Armonk, NY (US)

(72) Inventors: Jared Barney Hertzberg, Ossining, NY (US); Werner A. Rausch, Stormville, NY (US); Sami Rosenblatt, White Plains, NY (US); Rasit O. Topaloglu, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 46 days.

This patent is subject to a terminal disclaimer.

(21) Appl. No.: 16/020,902

(22) Filed: Jun. 27, 2018

(65) Prior Publication Data

US 2019/0130302 A1  May 2, 2019

Related U.S. Application Data

(63) Continuation of application No. 15/795,763, filed on Oct. 27, 2017, now Pat. No. 10,068,184.

(51) Int. Cl.
*G06N 99/00* (2019.01)
*H01L 27/18* (2006.01)
(Continued)

(52) U.S. Cl.
CPC ............. *G06N 10/00* (2019.01); *H01G 4/008* (2013.01); *H01L 27/18* (2013.01); *H01L 39/025* (2013.01);
(Continued)

(58) Field of Classification Search
CPC . H01L 39/223; H01L 28/60; H01L 23/53285; H01L 23/5329; H01L 39/025;
(Continued)

(56) References Cited

U.S. PATENT DOCUMENTS 5,446,016 A * 8/1995 Tanaka ................. H01L 39/2464
216/3
9,524,470 B1 * 12/2016 Chow .................... G06N 99/002
(Continued)

FOREIGN PATENT DOCUMENTS

| CN | 101950685 A | 1/2011 |
| CN | 102709071 A | 10/2012 |
| CN | 103346148 A1 | 10/2013 |

OTHER PUBLICATIONS

List of IBM Patents or Applications Treated as Related, 2018.
PCT, International Searching Authority, PCT/IB2017/058102, dated Jul. 25, 2018.

*Primary Examiner* — Vibol Tan
(74) *Attorney, Agent, or Firm* — Garg Law Firm, PLLC; Grant Johnson

(57) ABSTRACT

A vertical q-capacitor includes a trench in a substrate through a layer of superconducting material. A superconductor is deposited in the trench forming a first film on a first surface, a second film on a second surface, and a third film of the superconductor on a third surface of the trench. The first and second surfaces are substantially parallel, and the third surface in the trench separates the first and second surfaces. A dielectric is exposed below the third film by etching. A first coupling is formed between the first film and a first contact, and a second coupling is formed between the second film and a second contact in a superconducting quantum logic circuit. The first and second couplings cause the first and second films to operate as the vertical q-capaci- (Continued)

tor that maintains integrity of data in the superconducting quantum logic circuit within a threshold level.

24 Claims, 18 Drawing Sheets

(51) Int. Cl.
  *G06N 10/00* (2019.01)
  *H01G 4/008* (2006.01)
  *H01L 39/24* (2006.01)
  *H01L 39/02* (2006.01)
  *H01L 39/22* (2006.01)

(52) U.S. Cl.
  CPC ........ *H01L 39/223* (2013.01); *H01L 39/2409* (2013.01)

(58) Field of Classification Search
  CPC ......... H01L 21/02107; H01L 21/02123; H01L 21/0226; H01L 21/02269; H01L 21/02271; H01L 21/02356; H01L 21/3141; H01L 21/32051; H01L 21/32058; H01L 21/67063; H01L 21/76286; H01L 21/76802; H01L 21/76891; H01L 23/49888; H01L 23/5222; H01L 23/642; G06N 99/002; B82Y 10/00; H01G 4/008
  See application file for complete search history.

(56) References Cited

U.S. PATENT DOCUMENTS

| | | |
|---|---|---|
| 2008/0116448 A1 | 5/2008 | Kitaev |
| 2013/0029848 A1 | 1/2013 | Gonzalez et al. |
| 2016/0380026 A1 | 12/2016 | Abraham et al. |
| 2017/0256698 A1 | 9/2017 | Nayfeh et al. |

* cited by examiner (PRIOR-ART)

VERTICAL SUPERCONDUCTING CAPACITORS FOR TRANSMON QUBITS

TECHNICAL FIELD

The present invention relates generally to a semiconductor device, a fabrication method, and fabrication system for reducing the footprint of capacitive devices in superconducting quantum logic circuits. More particularly, the present invention relates to a device, method, and system for vertical superconducting capacitor for transmon qubit (vertical q-capacitor).

BACKGROUND

Hereinafter, a "Q" or "q" prefix in a word of phrase is indicative of a reference of that word or phrase in a quantum computing context unless expressly distinguished where used.

Molecules and subatomic particles follow the laws of quantum mechanics, a branch of physics that explores how the physical world works at the most fundamental levels. At this level, particles behave in strange ways, taking on more than one state at the same time, and interacting with other particles that are very far away. Quantum computing harnesses these quantum phenomena to process information.

The computers we use today are known as classical computers (also referred to herein as "conventional" computers or conventional nodes, or "CN"). A conventional computer uses a conventional processor fabricated using semiconductor materials and technology, a semiconductor memory, and a magnetic or solid-state storage device, in what is known as a Von Neumann architecture. Particularly, the processors in conventional computers are binary processors, i.e., operating on binary data represented in 1 and 0.

A quantum processor (q-processor) uses the odd nature of entangled qubit devices (compactly referred to herein as "qubit," plural "qubits) to perform computational tasks. In the particular realms where quantum mechanics operates, particles of matter can exist in multiple states—such as an "on" state, an "off" state, and both "on" and "off" states simultaneously. Where binary computing using semiconductor processors is limited to using just the on and off states (equivalent to 1 and 0 in binary code), a quantum processor harnesses these quantum states of matter to output signals that are usable in data computing.

Conventional computers encode information in bits. Each bit can take the value of 1 or 0. These is and Os act as on/off switches that ultimately drive computer functions. Quantum computers, on the other hand, are based on qubits, which operate according to two key principles of quantum physics: superposition and entanglement. Superposition means that each qubit can represent both a 1 and a 0 at the same time. Entanglement means that qubits in a superposition can be correlated with each other in a non-classical way; that is, the state of one (whether it is a 1 or a 0 or both) can depend on the state of another, and that there is more information that can be ascertained about the two qubits when they are entangled than when they are treated individually.

Using these two principles, qubits operate as more sophisticated processors of information, enabling quantum computers to function in ways that allow them to solve difficult problems that are intractable using conventional computers. IBM has successfully constructed and demonstrated the operability of a quantum processor (IBM is a registered trademark of International Business Machines corporation in the United States and in other countries.)

A superconducting qubit may include a Josephson junction. A Josephson junction is formed by separating two thin-film superconducting metal layers by a non-superconducting material. When the metal in the superconducting layers is caused to become superconducting—e.g. by reducing the temperature of the metal to a specified cryogenic temperature—pairs of electrons can tunnel from one superconducting layer through the non-superconducting layer to the other superconducting layer. In a superconducting qubit, the Josephson junction—which has a small inductance—is electrically coupled in parallel with one or more capacitive devices forming a nonlinear resonator.

The information processed by qubits is emitted in the form of microwave energy in a range of microwave frequencies. The microwave emissions are captured, processed, and analyzed to decipher the quantum information encoded therein. For quantum computing of qubits to be reliable, quantum circuits, e.g., the qubits themselves, the readout circuitry associated with the qubits, and other types of superconducting quantum logic circuits, must not alter the energy states of the particles or the microwave emissions in any significant manner. This operational constraint on any circuit that operates with quantum information necessitates special considerations in fabricating semiconductor structures that are used in such a circuit.

The illustrative embodiments recognize that a capacitor that is used in a superconducting quantum logic circuit, and particularly in a qubit—e.g. in conjunction with a Josephson junction—has to be fabricated according to this operational constraint. The presently used capacitor structure in a qubit is significantly larger in size than the size of the Josephson junction therein. FIG. 1 depicts a scaled view of a presently fabricated qubit. As can be seen, almost the entire area of qubit 100 is occupied by capacitor structure 102. Josephson junction 104 occupies a relatively insignificant area of qubit 100 as compared to the area occupied by capacitor structures 102.

The large size of the capacitor limits the number of qubits and other quantum readout circuitry that can be fabricated per die in a fabrication process. The illustrative embodiments recognize that a need exists for a method of fabricating a q-capacitor that is significantly smaller in the area occupied on the chip as compared to the presently used capacitor in quantum circuits, e.g., qubit 100. A q-capacitor is a capacitive device structure fabricated using superconducting material(s), where the capacitive structure is usable in a superconducting quantum logic circuit which stores and employs a single quantum of microwave energy during the operation cycle of the quantum logic circuit. Any absorption or dissipation of this energy, any spontaneous additions of energy, or fluctuations in the capacitance, arising in the q-capacitor, will degrade the circuit performance. An acceptable maximum threshold of these effects may be defined for a q-capacitor to function in the quantum logic circuit. A q-capacitor can be fabricated by using one or more superconducting materials on a silicon substrate in a semiconductor fabrication process, as described herein.

SUMMARY

The illustrative embodiments provide a semiconductor device, and a method and system of fabrication therefor. A semiconductor device of an embodiment comprises a vertical q-capacitor, which includes a trench through a layer of superconducting material, the trench reaching a depth in a substrate, the depth being substantially orthogonal to a plane of fabrication of the substrate. The embodiment further includes a superconducting material deposited in the trench, wherein deposited superconducting material forms a first film of the superconducting material on a first surface of the trench, a second film of the superconducting material on a second surface of the trench, and a third film of the superconducting material on a third surface of the trench, wherein the second surface is substantially parallel to the first surface, and the third surface in the trench separates the first surface and the second surface. The embodiment further includes a dielectric material below the third film, wherein the dielectric material exposed by etching the third film. The embodiment further includes a first coupling between the first film and a first contact in a superconducting quantum logic circuit. The embodiment further includes a second coupling between the second film and a second contact in the superconducting quantum logic circuit, the first coupling and the second coupling causing the first film and the second film to operate as the vertical q-capacitor that maintains integrity of data in the superconducting quantum logic circuit within a threshold level. Thus the embodiment provides a vertical q-capacitor that occupies a significantly smaller space on a qubit as compared to a presently used capacitor.

Another embodiment further includes a space between the first surface of the trench and the second surface of the trench, wherein vacuum occupies the space, wherein the third surface is a bottom surface of the trench, and wherein the vacuum forms a gap between the first film and the second film. Thus, the embodiment provides a single trench vacuum-gap vertical q-capacitor in which the dielectric is the vacuum.

Another embodiment further includes a structure of a second dielectric material, wherein the trench comprises a first trench and a second trench, wherein the depth of the trench is a first depth of the first trench, and a second depth of the second trench is substantially parallel to the first depth of the first trench, wherein the structure is formed between the first trench and the second trench, wherein the first surface of the trench comprises a surface of the first trench formed by the structure, wherein the second surface of the trench comprises a surface of the second trench formed by the structure, and wherein the third surface of the trench comprises a surface of the structure separating the first surface and the second surface. Thus, the embodiment provides a multiple-trench vertical q-capacitor.

In another embodiment, the second dielectric material of the structure comprises a material of the substrate. Thus, the embodiment provides a multiple-trench vertical q-capacitor in which the dielectric is the substrate material.

Another embodiment further includes the second dielectric material deposited over the plane of fabrication of the substrate, wherein the superconducting material is deposited over the second dielectric material, wherein the first depth and the second depth end in the second dielectric material without reaching the substrate. Thus, the embodiment provides a multiple-trench vertical q-capacitor in which the dielectric is a second dielectric material of choice.

Another embodiment further includes a first coupling formed using the superconducting material, between the first film and the first contact. The embodiment further includes a second coupling formed using the superconducting material, between the second film and the second contact. Thus, the embodiment provides a manner of coupling the vertical q-capacitor to the superconducting quantum logic circuit.

Another embodiment further includes the superconducting material deposited on the substrate. Thus, the embodiment provides a manner of forming a superconducting layer on the substrate.

In another embodiment, the superconducting material is Niobium (Nb) and the substrate comprises high-resistivity Silicon (Si). Thus, the embodiment provides specific materials usable in forming the vertical q-capacitor.

An embodiment includes a fabrication method for fabricating the semiconductor device.

An embodiment includes a fabrication system for fabricating the semiconductor device.

BRIEF DESCRIPTION OF THE DRAWINGS

The novel features of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

Figure 1:
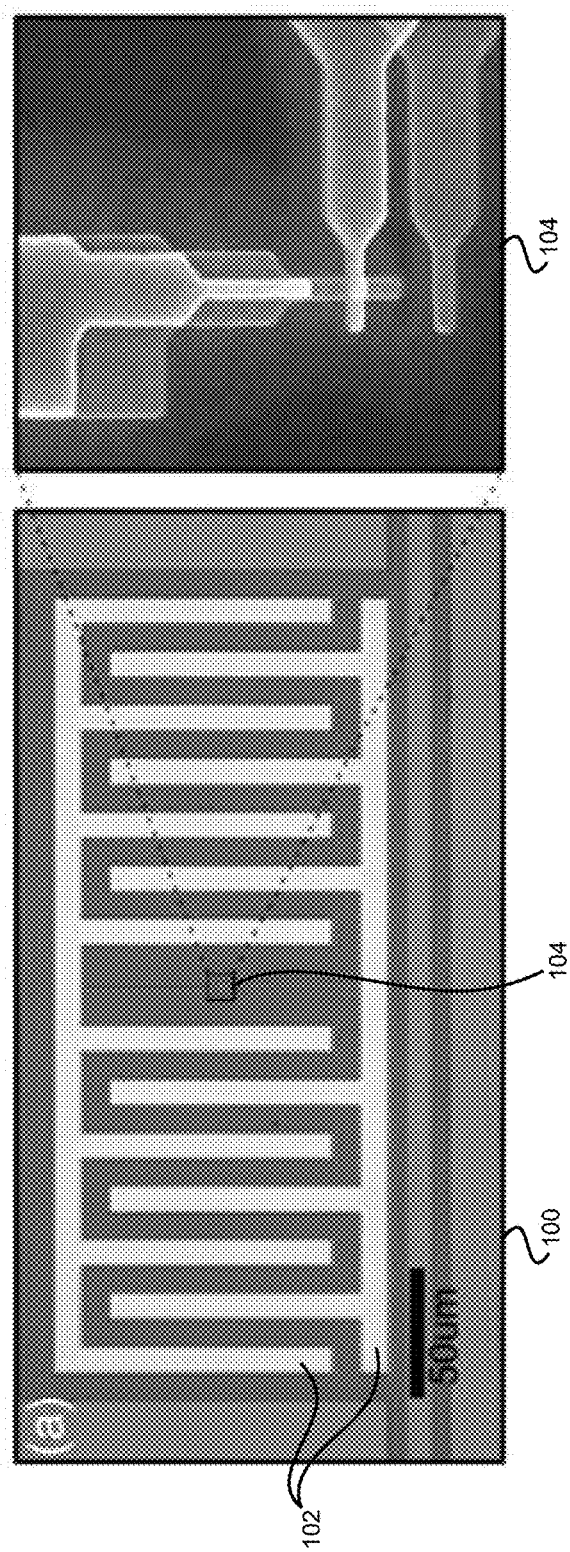
FIG. 1 depicts a scaled view of a presently fabricated qubit.

The illustrative embodiments used to describe the invention generally address and solve the above-described need for vertical q-capacitors. The illustrative embodiments provide a fabrication method for vertical q-capacitors.

An embodiment can be implemented as a capacitive device in superconducting quantum logic circuit, including but not limited to as a q-capacitor coupled to a Josephson junction in a qubit chip. A fabrication method for vertical q-capacitors can be implemented as a software application. The application implementing an embodiment can be configured to operate in conjunction with an existing semiconductor fabrication system—such as a lithography system.

For the clarity of the description, and without implying any limitation thereto, the illustrative embodiments are described using a simplified diagram of the example q-capacitor in the figures and the illustrative embodiments. In an actual fabrication of a q-capacitor, additional structures that are not shown or described herein, or structures different from those shown and described herein, may be present without departing the scope of the illustrative embodiments. Similarly, within the scope of the illustrative embodiments, a shown or described structure in the example q-capacitor may be fabricated differently to yield a similar operation or result as described herein.

Differently shaded portions in the two-dimensional drawing of the example structures, layers, and formations are intended to represent different structures, layers, materials, and formations in the example fabrication, as described herein. The different structures, layers, materials, and formations may be fabricated using suitable materials that are known to those of ordinary skill in the art.

A specific shape, location, position, or dimension of a shape depicted herein is not intended to be limiting on the illustrative embodiments unless such a characteristic is expressly described as a feature of an embodiment. The shape, location, position, dimension, or some combination thereof, are chosen only for the clarity of the drawings and the description and may have been exaggerated, minimized, or otherwise changed from actual shape, location, position, or dimension that might be used in actual photolithography to achieve an objective according to the illustrative embodiments.

An embodiment when implemented in an application causes a fabrication process to perform certain steps as described herein. The steps of the fabrication process are depicted in the several figures. Not all steps may be necessary in a particular fabrication process. Some fabrication processes may implement the steps in different order, combine certain steps, remove or replace certain steps, or perform some combination of these and other manipulations of steps, without departing the scope of the illustrative embodiments.

The illustrative embodiments are described with respect to certain types of materials, electrical properties, structures, formations, layers orientations, directions, steps, operations, planes, dimensions, numerosity, data processing systems, environments, components, and applications only as examples. Any specific manifestations of these and other similar artifacts are not intended to be limiting to the invention. Any suitable manifestation of these and other similar artifacts can be selected within the scope of the illustrative embodiments.

The illustrative embodiments are described using specific designs, architectures, layouts, schematics, and tools only as examples and are not limiting to the illustrative embodiments. The illustrative embodiments may be used in conjunction with other comparable or similarly purposed designs, architectures, layouts, schematics, and tools.

The examples in this disclosure are used only for the clarity of the description and are not limiting to the illustrative embodiments. Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

A qubit is only used as a non-limiting example superconducting quantum logic circuit in which an embodiment can be used. From this disclosure, those of ordinary skill in the art will be able to conceive many other superconducting quantum logic circuits in which the vertical q-capacitors of the illustrative embodiments will be usable, and the same are contemplated within the scope of the illustrative embodiments.

Figure 2:
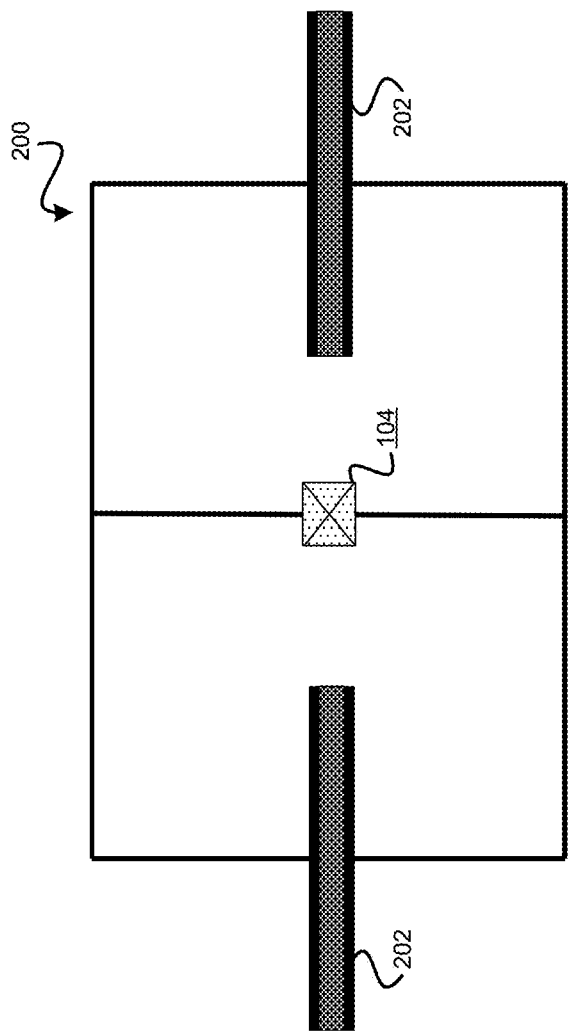
FIG. 2 depicts a schematic of a q-capacitor used in a qubit in accordance with an illustrative embodiment.

With reference to FIG. 2, this figure depicts a schematic of a q-capacitor used in a qubit in accordance with an illustrative embodiment. Q-capacitor 202 represents a q-capacitor fabricated in a manner described herein, and coupled to Josephson junction 104 in qubit 200.

Figure 3:
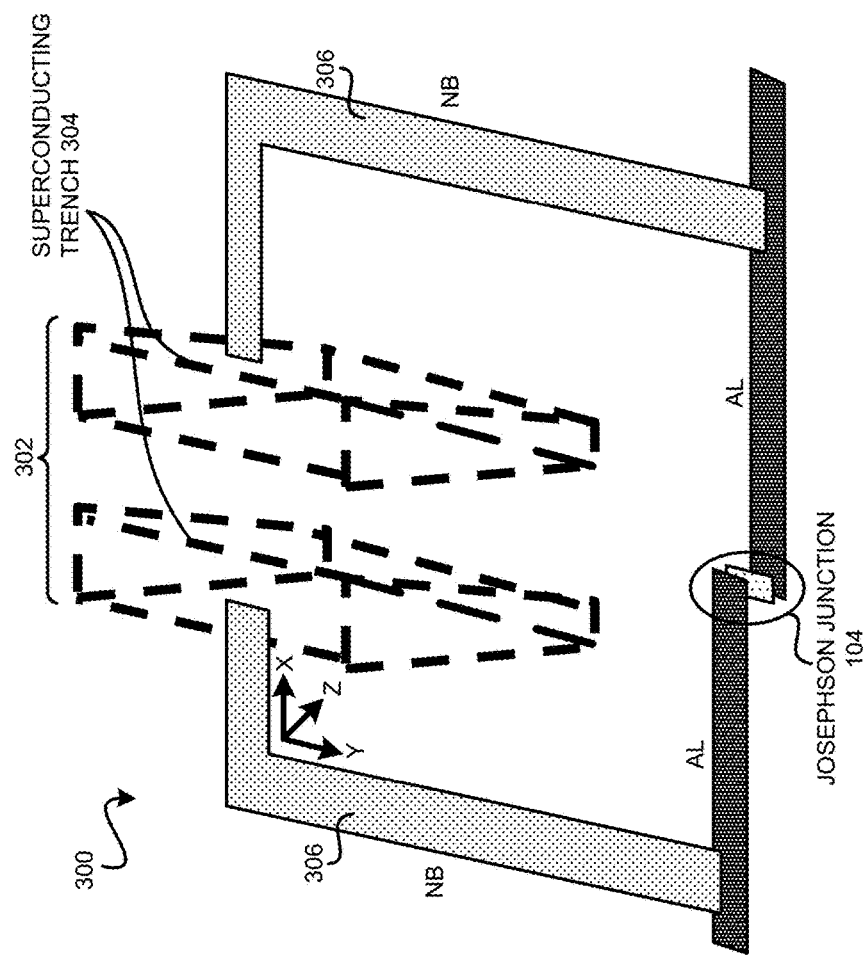
FIG. 3 depicts a simulated three-dimensional view of a structure used in a vertical q-capacitor in accordance with an illustrative embodiment.

With reference to FIG. 3, this figure depicts a simulated three-dimensional view of a structure used in a vertical q-capacitor in accordance with an illustrative embodiment. X-Y-Z coordinate axes are depicted for convenience. The substrate (not shown) plane of fabrication is the XY plane. A vertical q-capacitor according to the illustrative embodiments is a q-capacitor in which the plates are formed vertically in the substrate, in a direction substantially perpendicular to a plane of fabrication.

In the depicted example, Josephson junction 104 is fabricated using Aluminum (Al) metal thin-films, which become superconducting at transition temperature of 1.2 degrees Kelvin, and a suitable dielectric material, such as Aluminum Oxide. The Al thin-films are oriented on or substantially parallel to the XY plane, separated from one another in Z direction by the dielectric material.

Vertical q-capacitor 302 comprises trenches 304 trenched in Z direction in the substrate with the depth of the trenches being below the XY plane of fabrication of Josephson junction 104. The semiconductor substrate occupies the space that separates the trenches from one another in the pair of trenches 304. Trenches 304, when suitably fabricated as described herein, form the thin-film (plate, plates) that hold the capacitor's charge across the gap between the electrodes on opposite sides of the trench sidewalls as in a single trench embodiment (vacuum dielectric) depicted herein or between adjacent trenches as depicted in an embodiment with multiple trenches (silicon dielectric). Vertical q-capacitor 302 further comprises superconducting leads or connections 306 to Josephson junction 104. Leads of the q-capacitor and those of the junction may be capacitively coupled.

Niobium (Nb) is an example superconducting material used in the fabrication of vertical q-capacitor 302. For example, trenches 304 and leads 306 are fabricated using Nb as described herein. Other superconducting materials may be substituted for Nb under appropriate implementation-specific circumstances, and such substitutions are contemplated within the scope of the illustrative embodiments. Titanium, Titanium Nitride, Niobium Nitride, Niobium Titanium Nitride, and Tantalum are some other possible superconducting materials that may be used in a similar manner under certain circumstances.

Figure 4:
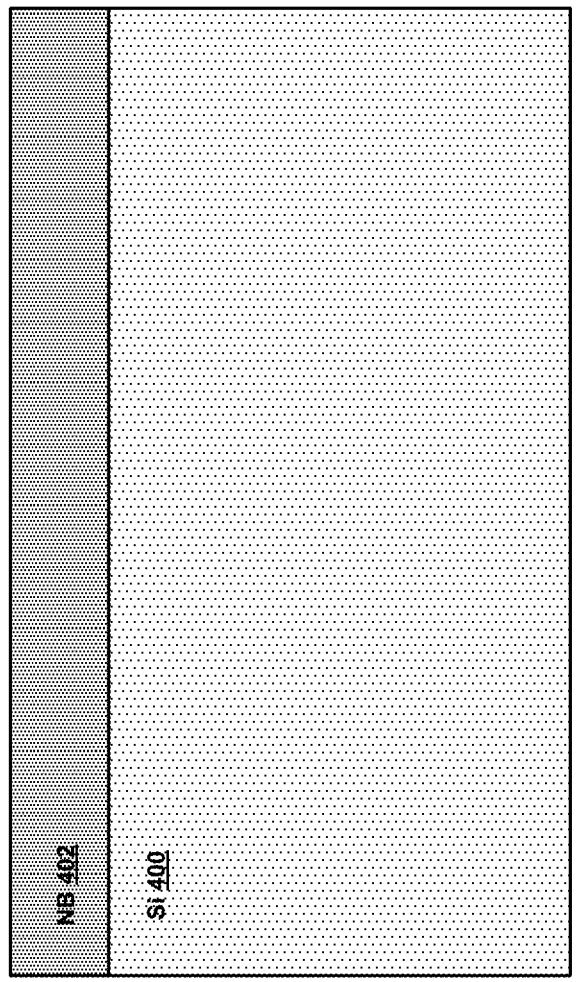
FIG. 4 depicts a step in an example fabrication process for vertical q-capacitors in accordance with an illustrative embodiment.

With reference to FIG. 4, this figure depicts a step in an example fabrication process for vertical q-capacitors in accordance with an illustrative embodiment. As an example, substrate 400 is formed of high-resistivity silicon (Si). Alternatively, sapphire may be used instead of high-resistivity silicon. Essentially, these types of substrate are compatible with low loss in the microwave regime.

A suitable superconducting material 402, in this case Nb, is layered on substrate 400. For a non-limiting deposition method of layering, sputtering may be utilized.

Figure 5:
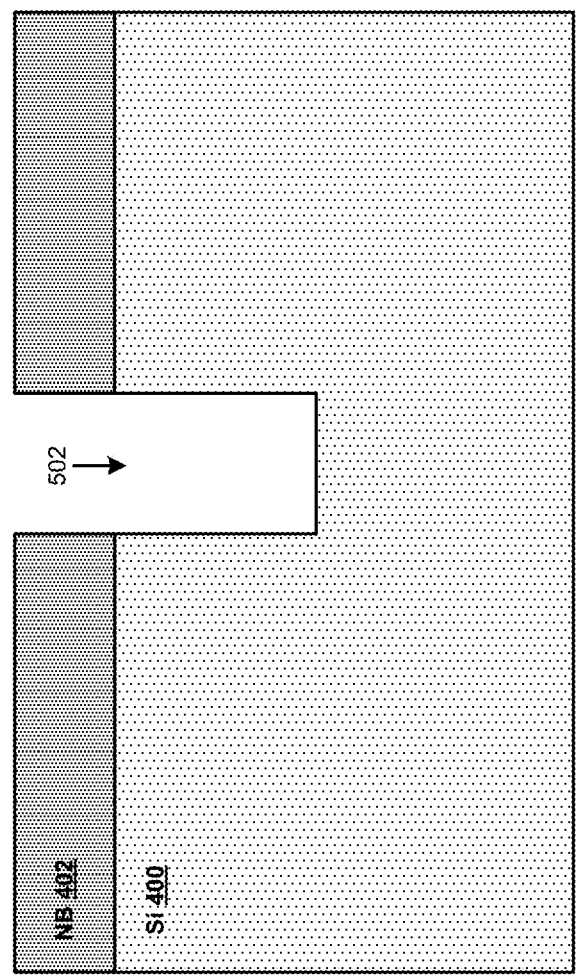
FIG. 5 depicts a step in an example fabrication process for vacuum-gap vertical q-capacitors in accordance with an illustrative embodiment.

With reference to FIG. 5, this figure depicts a step in an example fabrication process for vacuum-gap vertical q-capacitors in accordance with an illustrative embodiment. A q-capacitor fabricated in a substrate has two electric field components—from one plate to another across the gap that separates the plates, and from one plate to another through the substrate below. This figure depicts a manner of fabricating vertical q-capacitor 302 where vacuum between the plates acts as the separator.

Trench 502 is formed through superconducting material 402 and substrate 400 as shown. In one example fabrication process, trench 502 can be formed by patterning and etching away the materials from the location of trench 502, up to a designated depth of trench 502. In one non-limiting example implementation, the patterning can be accomplished with photolithography and the etching may be a deep etch such as a Bosch etch (deep reactive ion etching). A chemical etch process with KOH or TMAH is also possible but would require sacrificial materials such as nitrides or oxides, whose residues may adversely affect qubit performance.

Figure 6:
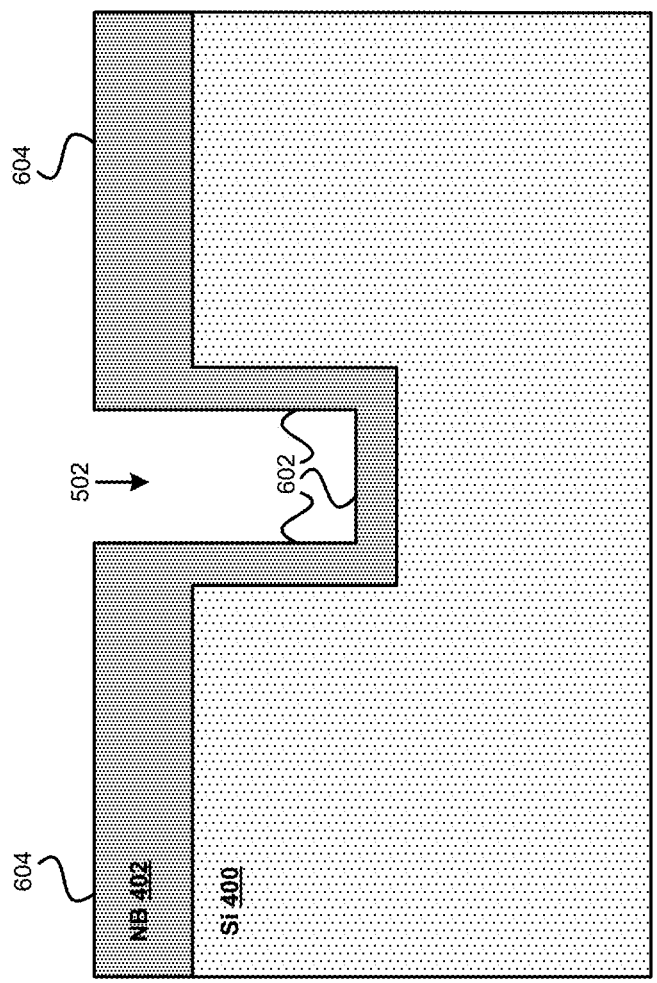
FIG. 6 depicts another step in an example fabrication process for vacuum-gap vertical q-capacitors in accordance with an illustrative embodiment.

With reference to FIG. 6, this figure depicts another step in an example fabrication process for vacuum-gap vertical q-capacitors in accordance with an illustrative embodiment. The walls and floor of trench 502 are lined with superconducting material 402. For example, using a suitable deposition method, layer 602 of superconducting material 402 is deposited on the walls and the floor of trench 502 as shown. Portions 604 of superconducting material 402 will form leads 306 shown in FIG. 3.

Again, if Nb is used as the superconducting material, sputtering method of depositing can be used. Deposition of Nb in this manner may eliminate a subtractive etch of the Nb afterwards in order to define the Nb around the trenches and other superconducting circuits on chip. In an alternate method, Titanium Nitride (TiN) is deposited by ALD (Atomic Layer Deposition), which is conformal, and therefore coats all surfaces by the same amount. TiN can be used alone or in conjunction with Nb.

In practice, the deep etch of trench 502 will leave sloped walls behind in trench 502, which will be covered by sputtered Nb as layer 602 in the deposition step that forms layer 602. But because the walls are sloped, the final thickness of Nb layer 602 on the walls of trench 502 will be thin unless enough material is deposited. A solution for adjusting the thickness of Nb in layer 602 is to perform angled evaporation from more than one direction in order to coat the sloped walls of trench 502. Another solution is to utilize ALD to conformally deposit TiN of the same thickness over all surfaces of trench 502.

Figure 7:
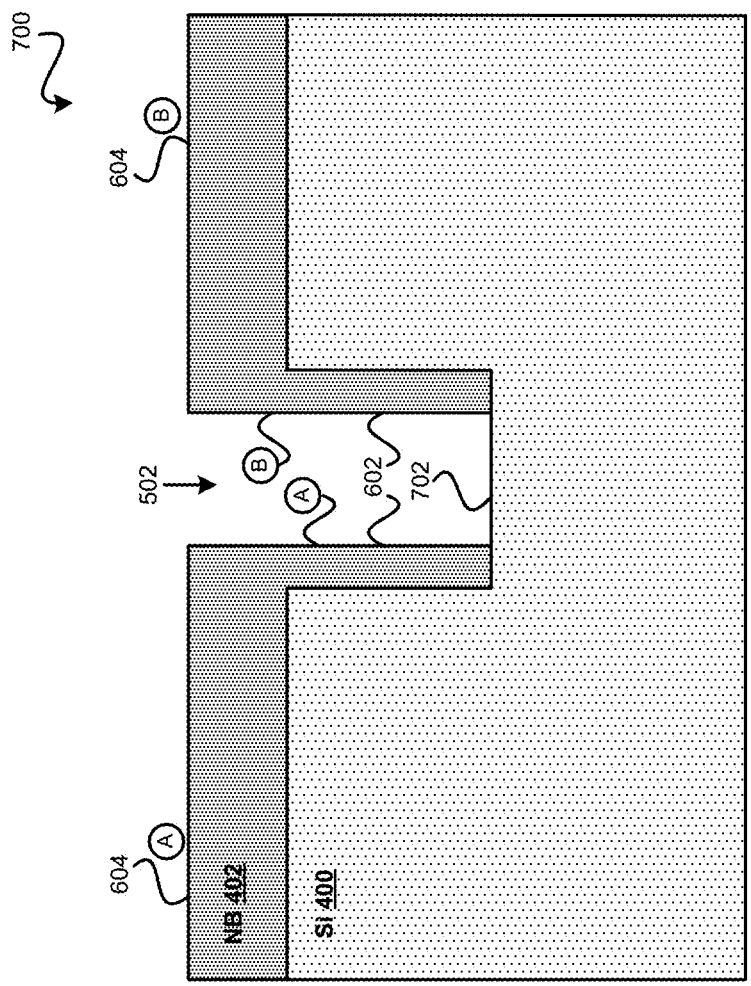
FIG. 7 depicts another step in an example fabrication process for vacuum-gap vertical q-capacitors in accordance with an illustrative embodiment.

With reference to FIG. 7, this figure depicts another step in an example fabrication process for vacuum-gap vertical q-capacitors in accordance with an illustrative embodiment. Superconducting material 402 is removed from the floor of trench 502. For example, using a suitable patterning and etching process, the floor portion of layer 602 of superconducting material 402 is removed to expose floor 702 of trench 502 as shown. Floor 702 electrically decouples the remaining wall portions 602. For example, wall portion A of 602 forms one plate of a vertical q-capacitor (plate A), wall portion B of 602 forms another plate of the vertical q-capacitor (plate B), plate A connects to lead A 604 of the vertical q-capacitor, and plate B connects to lead B 604 of the vertical q-capacitor. The vacuum in trench 502 between plates A and B forms the gap. Note that the vacuum in trench 502 need not be perfect vacuum, but can be created up to a degree that is suitable and sufficient for a given implementation. Thus, vertical q-capacitor 700 is formed with vacuum gap according to one embodiment.

Figure 8:
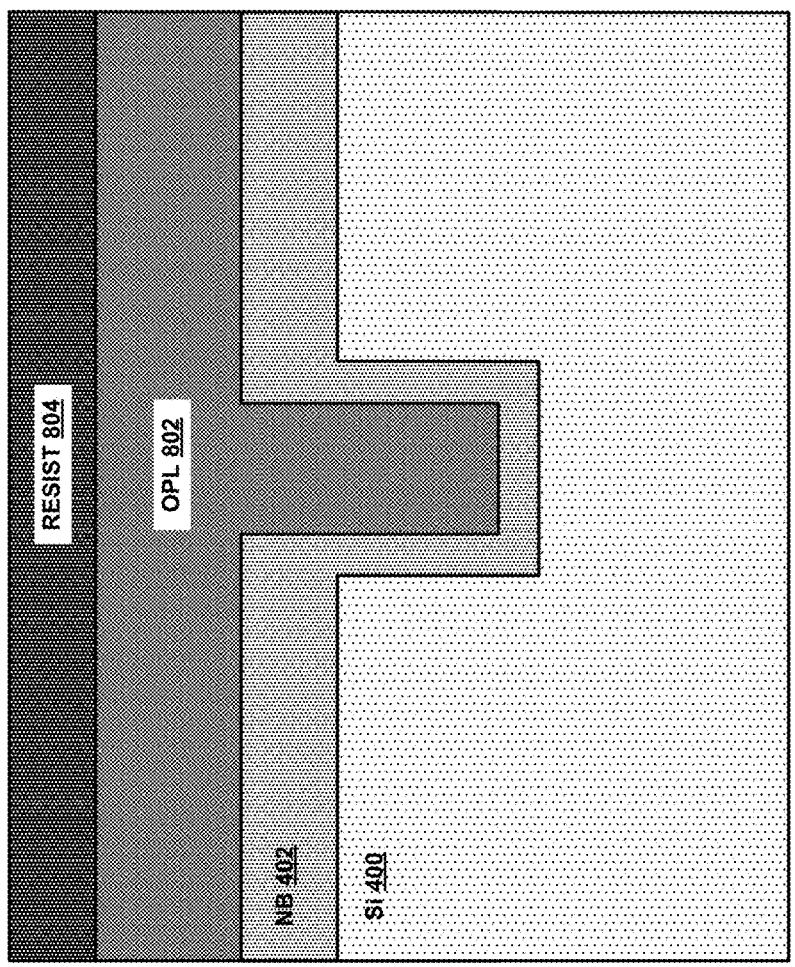
FIG. 8 depicts an alternative step in an alternative example fabrication process for vacuum-gap vertical q-capacitors in accordance with an illustrative embodiment.

With reference to FIG. 8, this figure depicts an alternative step in an alternative example fabrication process for vacuum-gap vertical q-capacitors in accordance with an illustrative embodiment. Superconducting material 402 is removed from the floor of trench 502 using a different method as compared to the patterning and etching of FIG. 7.

In this alternative step, after superconducting material 402 is deposited in trench 502 to form layer 602, optical planarization layer (OPL) material 802 is deposited over superconducting material 402, while also filling trench 502 with OPL 802. Layer 804 of a suitable photoresist material or a stack containing such material is formed over OPL 802.

Figure 9:
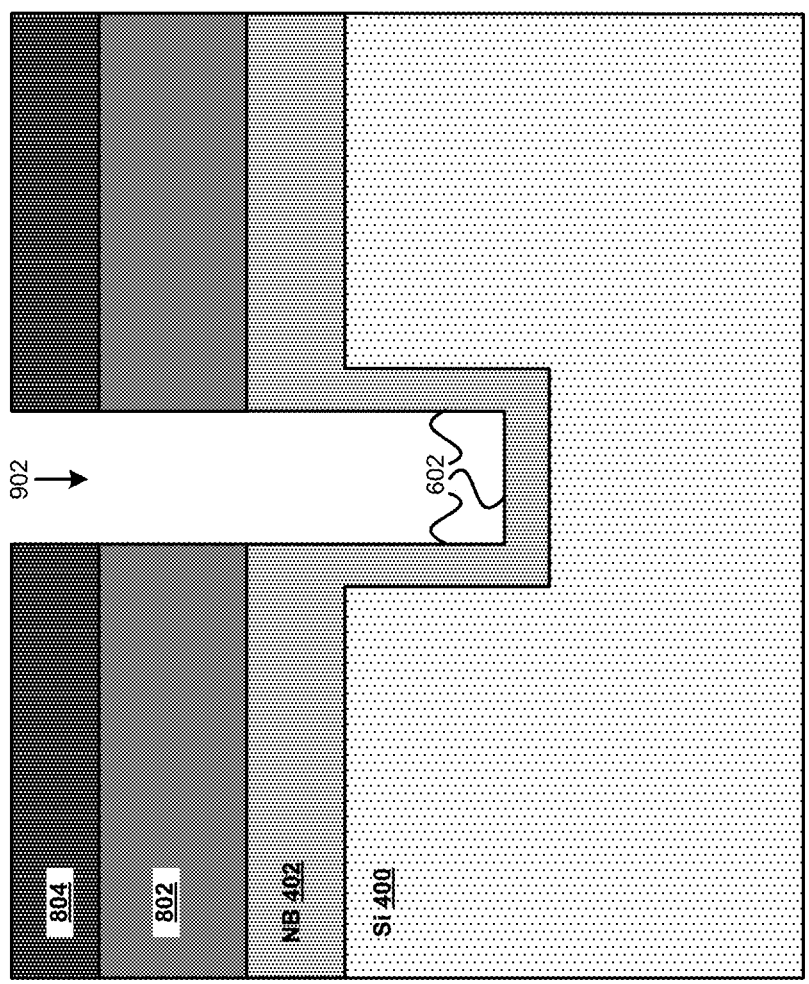
FIG. 9 depicts another step in the alternative example fabrication process for vacuum-gap vertical q-capacitors in accordance with an illustrative embodiment.

With reference to FIG. 9, this figure depicts another step in the alternative example fabrication process for vacuum-gap vertical q-capacitors in accordance with an illustrative embodiment. Trench 902 is formed through resist 804 and OPL 802 as shown. In one example fabrication process, trench 902 can be formed by patterning and etching away the materials from the location of trench 902, including removing OPL 802 from between the wall portions of layer 602, and up to the floor portion of layer 602, while leaving layer 602 substantially undisturbed.

Figure 10:
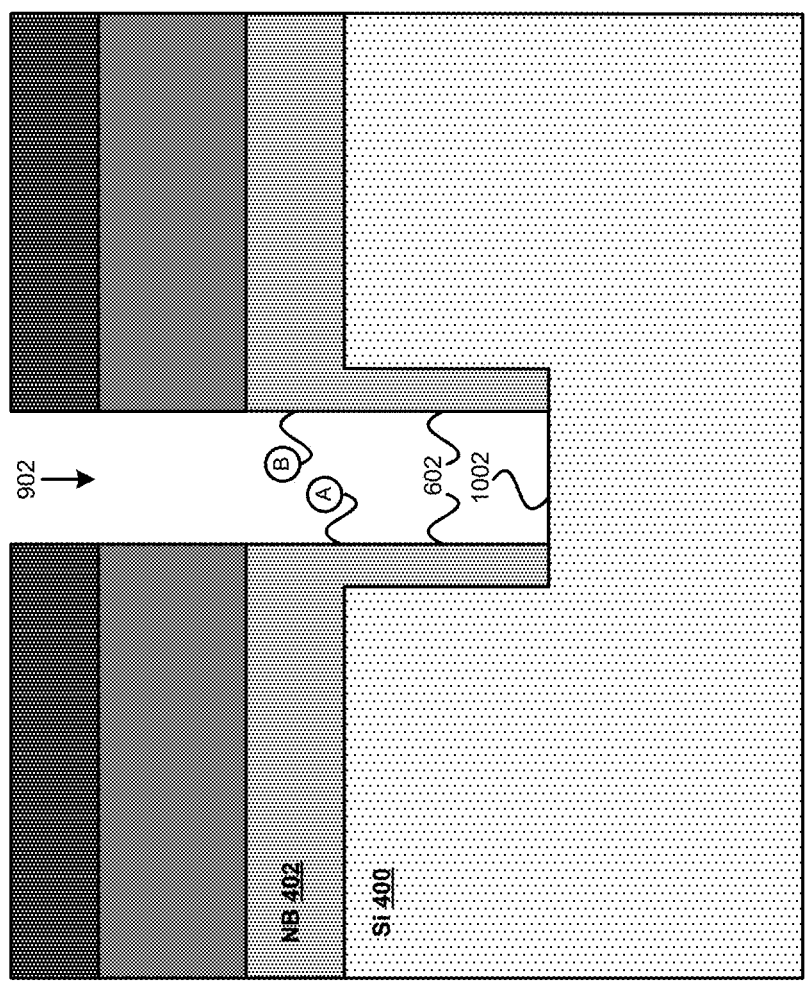
FIG. 10 depicts another step in the alternative fabrication process for vacuum-gap vertical q-capacitors in accordance with an illustrative embodiment.

With reference to FIG. 10, this figure depicts another step in the alternative fabrication process for vacuum-gap vertical q-capacitors in accordance with an illustrative embodiment. Superconducting material 402 is removed from the floor of trench 902. For example, using a suitable etching process, the floor portion of layer 602 of superconducting material 402 is removed to expose floor 1002 of trench 502 as shown. Floor 1002 electrically decouples the remaining wall portions A and B 602. Wall portion A of 602 forms one plate of a vertical q-capacitor (plate A), wall portion B of 602 forms another plate of the vertical q-capacitor (plate B). The vacuum in trench 502 between plates A and B forms the gap.

Figure 11:
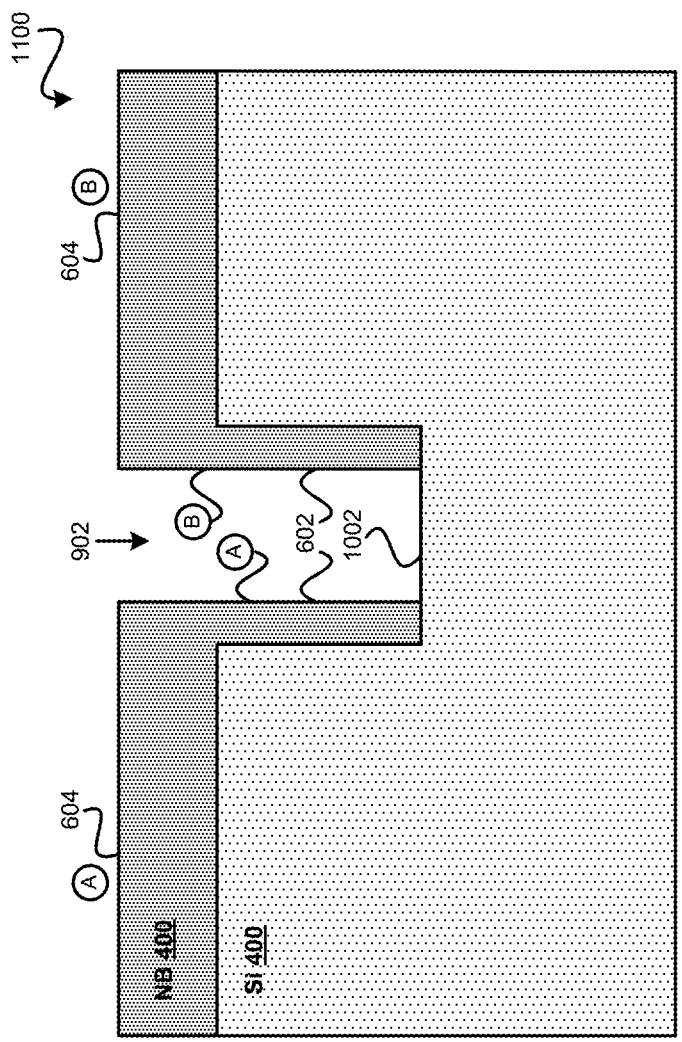
FIG. 11 depicts another step in the alternative fabrication process for vacuum-gap vertical q-capacitors in accordance with an illustrative embodiment.

With reference to FIG. 11, this figure depicts another step in the alternative fabrication process for vacuum-gap vertical q-capacitors in accordance with an illustrative embodiment. Remaining resist material 804 and remaining OPL material 802 are removed from superconducting material 402, where leads 604 are formed. Plate A 602 connects to lead A 604 of the vertical q-capacitor, and plate B 602 connects to lead B 604 of the vertical q-capacitor. Thus, vertical q-capacitor 1100 is formed with vacuum gap according to another embodiment.

Figure 12:
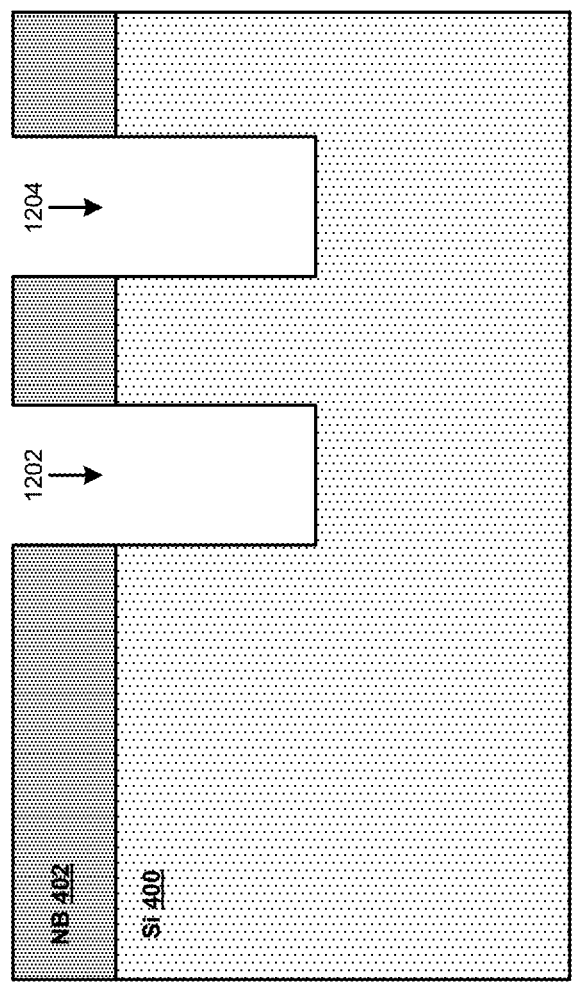
FIG. 12 depicts a step in an example fabrication process for silicon-dielectric vertical q-capacitors in accordance with an illustrative embodiment.

With reference to FIG. 12, this figure depicts a step in an example fabrication process for silicon-dielectric vertical q-capacitors in accordance with an illustrative embodiment. This figure depicts a manner of fabricating vertical q-capacitor 302 where silicon from the substrate is formed into a dielectric structure between the plates of the vertical q-capacitor.

Trenches 1202 and 1204 are formed through superconducting material 402 and substrate 400 as shown. In one example fabrication process, trenches 1202 and 1204 can be formed by patterning and etching away the materials from the locations of trenches 1202 and 1204, up to the designated depths of trenches 1202 and 1204.

Figure 13:
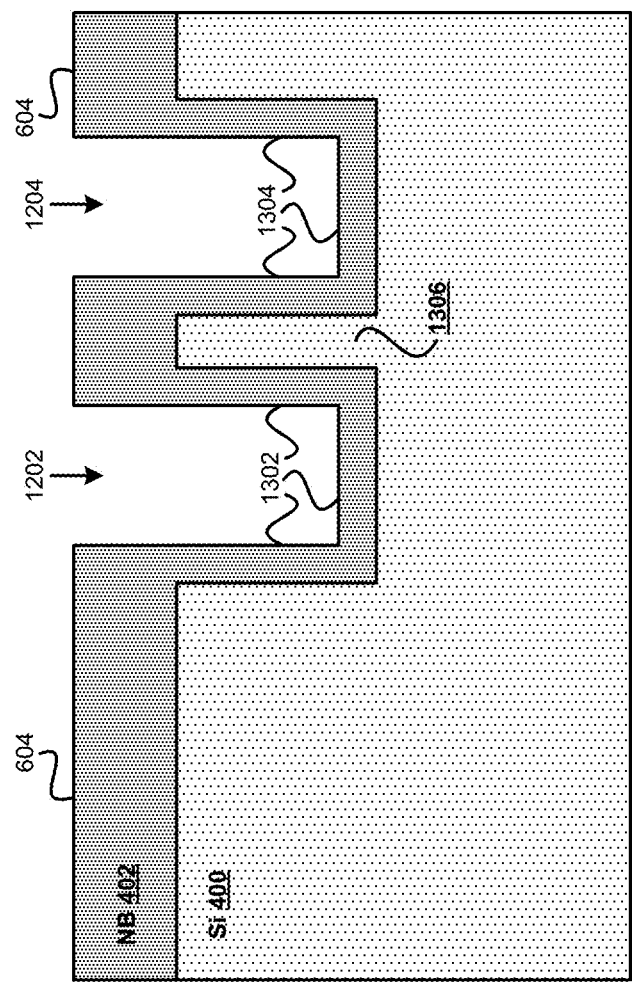
FIG. 13 depicts another step in an example fabrication process for silicon-dielectric vertical q-capacitors in accordance with an illustrative embodiment.

With reference to FIG. 13, this figure depicts another step in an example fabrication process for silicon-dielectric vertical q-capacitors in accordance with an illustrative embodiment. The walls and floor of trenches 1202 and 1204 are lined with superconducting material 402. For example, using a suitable deposition method—eg, sputtering for Nb or ALD for TiN, layer 1302 and 1304 of superconducting material 402 is deposited on the walls and the floor of trenches 1202 and 1204, respectively, as shown. Structure 1306 is thus formed of the substrate material 400 and is sandwiched between two layers of superconducting material 402 as shown. Portions 604 of superconducting material 402 will form leads 306 shown in FIG. 3.

Figure 14:
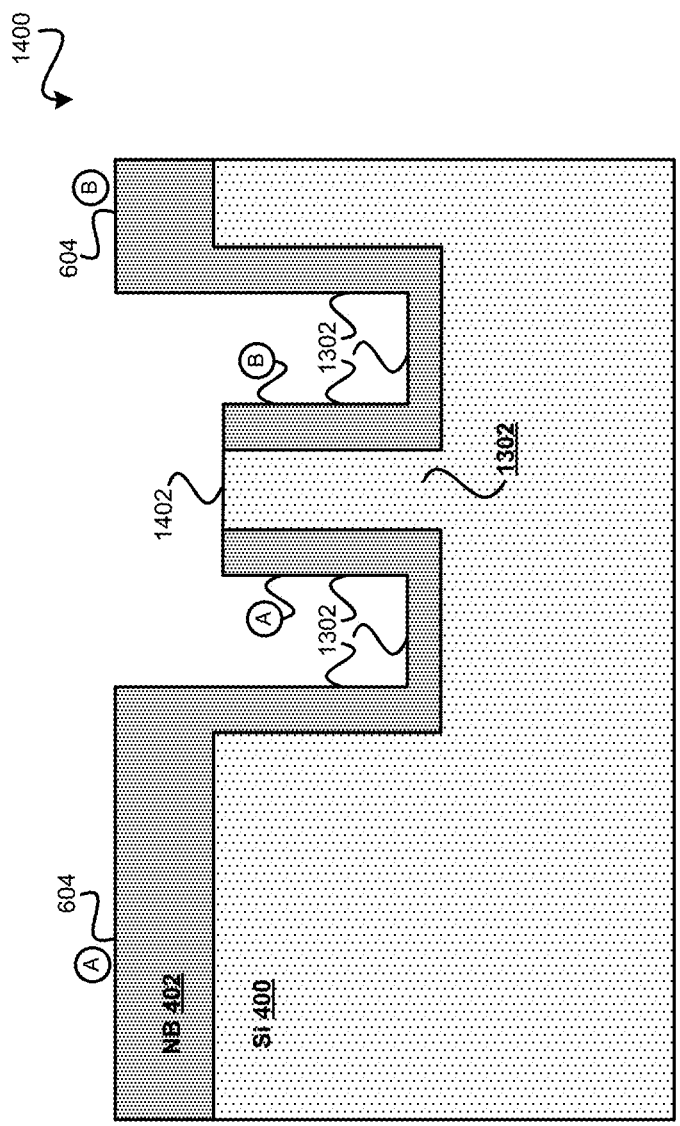
FIG. 14 depicts another step in an example fabrication process for silicon-dielectric vertical q-capacitors in accordance with an illustrative embodiment.

With reference to FIG. 14, this figure depicts another step in an example fabrication process for silicon-dielectric vertical q-capacitors in accordance with an illustrative embodiment. Superconducting material 402 is removed from the top of sandwiched substrate material structure 1306. For example, using a suitable patterning and etching process, the portion of superconducting material 402 that is directly over structure 1306 is removed to expose top 1402 of structure 1306 as shown.

This etch, in particular, does not require a deep etch, because only the superconducting material has to be etched. For example, this etching process could be a Chlorine-based reactive ion etch. Just as in the previous example, the OPL may be required because patterning the opening over the deep trenches may not be possible with regular resist because of the uneven landscape.

Top 1402 electrically decouples the remaining wall portions of layers 1302 and 1304. For example, wall portion A of layer 1302 forms one plate of a vertical q-capacitor (plate A), wall portion B of 1304 forms another plate of the vertical q-capacitor (plate B), plate A connects to lead A 604 of the vertical q-capacitor, and plate B connects to lead B 604 of the vertical q-capacitor. Substrate material 400 in structure 1306 between plates A and B forms the dielectric. Thus, vertical q-capacitor 1400 is formed with silicon dielectric according to one embodiment.

Substrate material 400 is used in structure 1306 only as an example embodiment. From this disclosure, those of ordinary skill in the art will be able to use other dielectric materials that are consistent with and suitable for the low microwave loss requirements of superconducting quantum devices, for forming structure 1306 in a similar manner and such formations, and the resulting vertical q-capacitors with different dielectrics, are contemplated within the scope of the illustrative embodiments.

Figure 15:
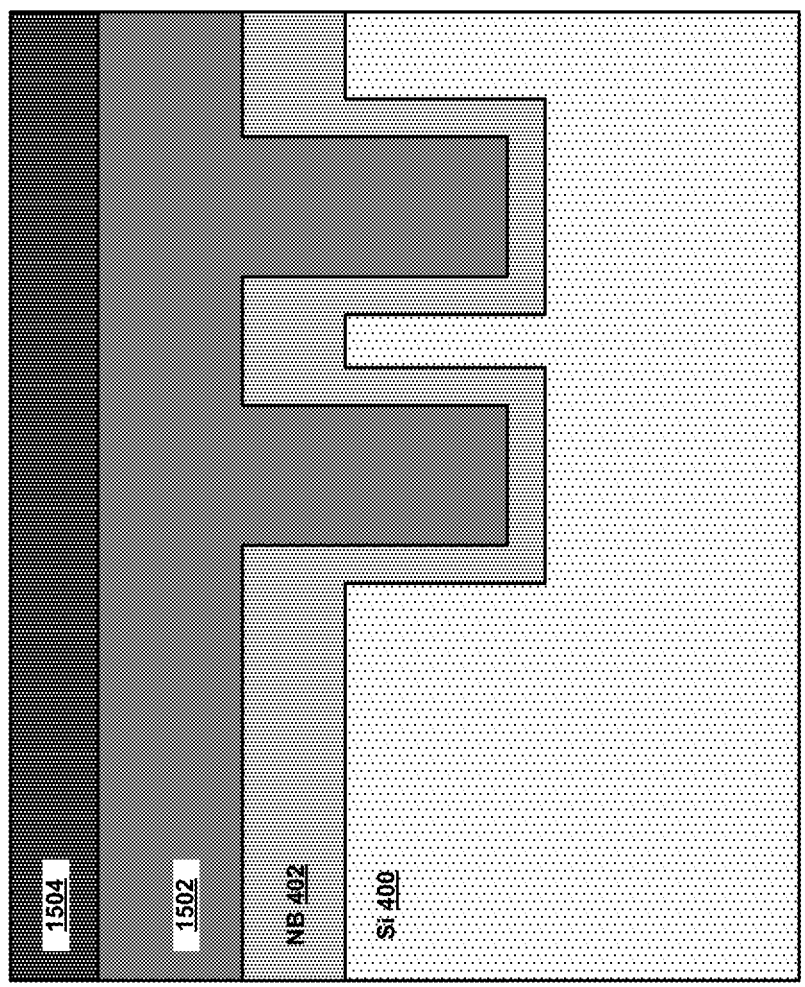
FIG. 15 depicts an alternative step in an alternative example fabrication process for silicon-dielectric vertical q-capacitors in accordance with an illustrative embodiment.

With reference to FIG. 15, this figure depicts an alternative step in an alternative example fabrication process for silicon-dielectric vertical q-capacitors in accordance with an illustrative embodiment. Superconducting material 402 is removed from the top of structure 1306 using a different method as compared to the patterning and etching of FIG. 14.

In this alternative step, after superconducting material 402 is deposited in trenches 1202 and 1204, to form layers 1302 and 1304, respectively, OPL material 1502 is deposited over superconducting material 402, while also filling trenches 1202 and 1204 with OPL 1502. Layer 1504 of a suitable photoresist material or a stack containing such material is formed over OPL 1502.

Figure 16:
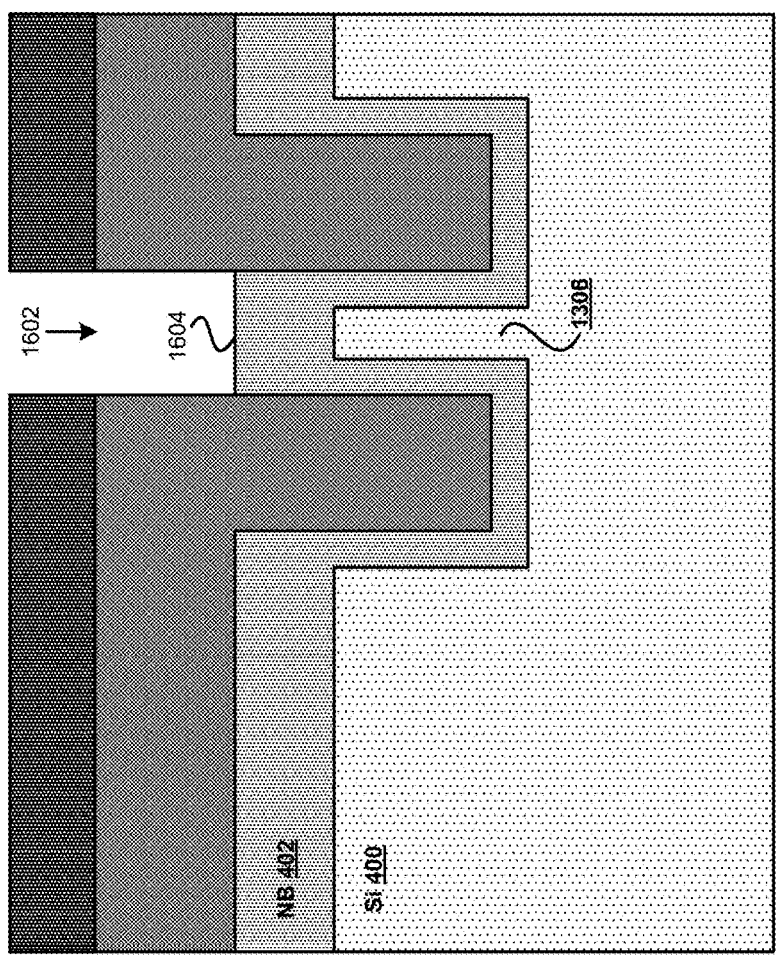
FIG. 16 depicts another step in the alternative example fabrication process for silicon-dielectric vertical q-capacitors in accordance with an illustrative embodiment.

With reference to FIG. 16, this figure depicts another step in the alternative example fabrication process for silicon-dielectric vertical q-capacitors in accordance with an illustrative embodiment. Trench 1602 is formed through resist 1504 and OPL 1502 as shown. In one example fabrication process, trench 1602 can be formed by patterning and etching away the materials from the location of trench 1602, including removing OPL 1502 from above portion 1604 of superconducting material 402, which was deposited during the depositing of layers 1302 and 1304, and up to and exposing the top of portion 1604.

Figure 17:
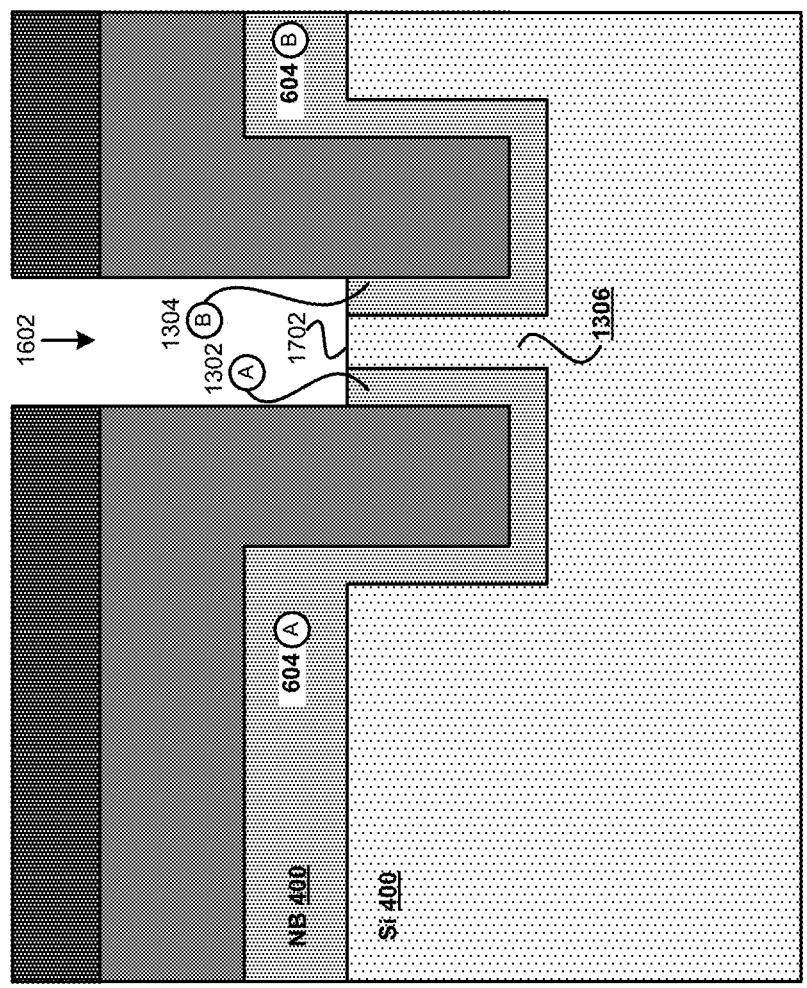
FIG. 17 depicts another step in the alternative fabrication process for silicon-dielectric vertical q-capacitors in accordance with an illustrative embodiment.

With reference to FIG. 17, this figure depicts another step in the alternative fabrication process for silicon-dielectric vertical q-capacitors in accordance with an illustrative embodiment. Portion 1604 is removed from trench 1602. For example, using a suitable patterning and etching process, portion 1604 of superconducting material 402 is removed to expose substrate material 400 of structure 1306 as shown. Top 1702 of structure 1306 electrically decouples the remaining wall portions 1302A and 1304B. Wall portion A of 1302 forms one plate of a vertical q-capacitor (plate A), wall portion B of 1304 forms another plate of the vertical q-capacitor (plate B). Substrate material 400 in structure 1306 between plates A and B forms the dielectric.

Figure 18:
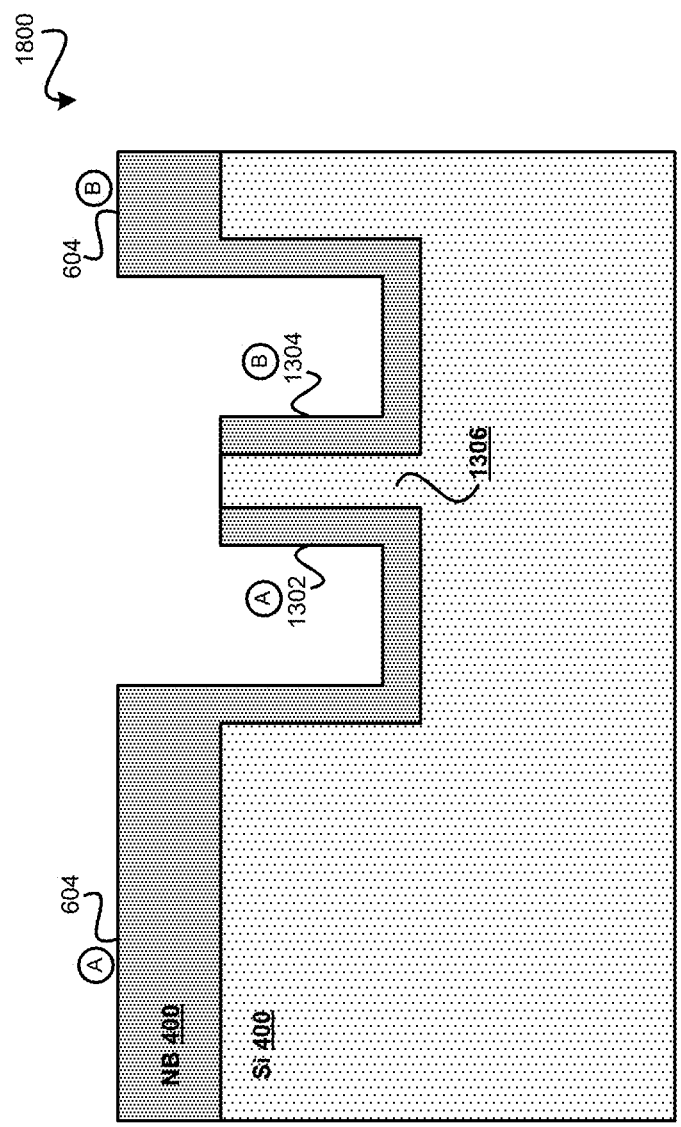
FIG. 18 depicts another step in the alternative fabrication process for silicon-dielectric vertical q-capacitors in accordance with an illustrative embodiment.

With reference to FIG. 18, this figure depicts another step in the alternative fabrication process for silicon-dielectric vertical q-capacitors in accordance with an illustrative embodiment. Remaining resist material 1504 and remaining OPL material 1502 are removed from atop superconducting material 402, where leads 604 are formed. Plate A 1302 connects to lead A 604 of the vertical q-capacitor, and plate B 1304 connects to lead B 604 of the vertical q-capacitor. Thus, vertical q-capacitor 1800 is formed with silicon dielectric according to another embodiment.

Substrate material 400 is used in structure 1306 as dielectric only as an example embodiment. From this disclosure, those of ordinary skill in the art will be able to use other dielectric materials suitable for and consistent with the low microwave loss requirements of superconducting quantum devices, for forming structure 1306 in a similar manner and such formations, and the resulting vertical q-capacitors with different dielectrics, are contemplated within the scope of the illustrative embodiments.

For similar capacitance values, a vacuum-gap vertical q-capacitor formed according to an embodiment with only 5 micrometers via height (the depth of the trench) occupies only approximately thirty percent of the surface area on a qubit chip as compared to a prior-art qubit planar capacitor. For similar capacitance values, a silicon-dielectric vertical q-capacitor formed according to an embodiment with only 25 micrometers via height (the height of the silicon dielectric structure) occupies only approximately seven and a half percent of the surface area on a qubit chip as compared to a prior-art qubit planar capacitor.

What is claimed is:

1. A vertical q-capacitor comprising:
a superconducting material deposited in a trench that is substantially orthogonal to a plane of fabrication, wherein deposited superconducting material forms a first film of the superconducting material on a first surface of the trench, and a second film of the superconducting material on a second surface of the trench, wherein the second surface is substantially parallel to the first surface;
a dielectric between the first film and the second film;
a first coupling between the first film and a first contact in a superconducting quantum logic circuit; and
a second coupling between the second film and a second contact in the superconducting quantum logic circuit, the first coupling and the second coupling causing the first film and the second film to operate as the vertical q-capacitor that maintains integrity of data in the superconducting quantum logic circuit within a threshold level.

2. The vertical q-capacitor of claim 1, further comprising:
a space between the first surface of the trench and the second surface of the trench, wherein vacuum occupies the space, and wherein the vacuum forms a gap between the first film and the second film.

3. The vertical q-capacitor of claim 1, further comprising:
a structure formed using a second dielectric material,
wherein the trench comprises a first trench and a second trench, wherein the depth of the trench is a first depth of the first trench, and a second depth of the second trench is substantially parallel to the first depth of the first trench,
wherein the structure is formed between the first trench and the second trench,
wherein the first surface of the trench comprises a surface of the first trench formed by the structure,
wherein the second surface of the trench comprises a surface of the second trench formed by the structure, and
wherein a surface of the structure separates the first surface and the second surface.

4. The vertical q-capacitor of claim 3, wherein the second dielectric material of the structure comprises a material of the substrate.

5. The vertical q-capacitor of claim 3, further comprising:
the second dielectric material deposited over the plane of fabrication of the substrate, wherein the superconducting material is deposited over the second dielectric material, wherein the first depth and the second depth end in the second dielectric material without reaching the substrate.

6. The vertical q-capacitor of claim 1, further comprising:
a first coupling formed using the superconducting material, between the first film and the first contact; and
a second coupling formed using the superconducting material, between the second film and the second contact.

7. The vertical q-capacitor of claim 1, further comprising:
the superconducting material deposited on the substrate.

8. The vertical q-capacitor of claim 1, wherein the superconducting material is Niobium (Nb) and the substrate comprises high-resistivity Silicon (Si).

9. A method comprising:
depositing a superconducting material in a trench that is substantially orthogonal to a plane of fabrication, wherein deposited superconducting material forms a first film of the superconducting material on a first surface of the trench, and a second film of the superconducting material on a second surface of the trench, wherein the second surface is substantially parallel to the first surface;
exposing a dielectric material between the first film and the second film; and
coupling the first film to a first contact in a superconducting quantum logic circuit and the second film to a second contact in the superconducting quantum logic circuit, the coupling causing the first film and the second film to operate as the vertical q-capacitor that maintains integrity of data in the superconducting quantum logic circuit within a threshold level.

10. The method of claim 9, further comprising:
creating, as a part of forming the trench, a space between the first surface of the trench and the second surface of the trench, wherein vacuum occupies the space; and
using the vacuum as gap between the first film and the second film.

11. The method of claim 9, further comprising:
creating, as a part of forming the trench, a structure of a second dielectric material,
wherein the trench comprises a first trench and a second trench, wherein the depth of the trench is a first depth of the first trench, and a second depth of the second trench is substantially parallel to the first depth of the first trench,
wherein the structure is formed between the first trench and the second trench,
wherein the first surface of the trench comprises a surface of the first trench formed by the structure,
wherein the second surface of the trench comprises a surface of the second trench formed by the structure, and
wherein a surface of the structure separates the first surface and the second surface.

12. The method of claim 11, wherein the second dielectric material of the structure comprises a material of the substrate.

13. The method of claim 11, further comprising:
depositing the second dielectric material over the plane of fabrication of the substrate; and
depositing the superconducting material over the second dielectric material, wherein the first depth and the second depth end in the second dielectric material without reaching the substrate.

14. The method of claim 9, further comprising:
forming, using the superconducting material, a first coupling between the first film and the first contact; and
forming, using the superconducting material, a second coupling between the second film and the second contact.

15. The method of claim 9, further comprising:
depositing on the substrate, the superconducting material.

16. The method of claim 9, wherein the superconducting material is Niobium (Nb) and the substrate comprises high-resistivity Silicon (Si).

17. A semiconductor fabrication system comprising a lithography component, the semiconductor fabrication system when operated to fabricate a semiconductor device performing operations comprising:
depositing a superconducting material in a trench that is substantially orthogonal to a plane of fabrication, wherein deposited superconducting material forms a first film of the superconducting material on a first surface of the trench, and a second film of the superconducting material on a second surface of the trench, wherein the second surface is substantially parallel to the first surface;

exposing a dielectric material between the first film and the second film; and coupling the first film to a first contact in a superconducting quantum logic circuit and the second film to a second contact in the superconducting quantum logic circuit, the coupling causing the first film and the second film to operate as the vertical q-capacitor that maintains integrity of data in the superconducting quantum logic circuit within a threshold level.

18. The semiconductor fabrication system of claim 17, further comprising:

creating, as a part of forming the trench, a space between the first surface of the trench and the second surface of the trench, wherein vacuum occupies the space; and using the vacuum as gap between the first film and the second film.

19. The semiconductor fabrication system of claim 17, further comprising:

creating, as a part of forming the trench, a structure of a second dielectric material, wherein the trench comprises a first trench and a second trench, wherein the depth of the trench is a first depth of the first trench, and a second depth of the second trench is substantially parallel to the first depth of the first trench, wherein the structure is formed between the first trench and the second trench, wherein the first surface of the trench comprises a surface of the first trench formed by the structure, wherein the second surface of the trench comprises a surface of the second trench formed by the structure, and wherein a surface of the structure separates the first surface and the second surface.

20. The semiconductor fabrication system of claim 19, wherein the second dielectric material of the structure comprises a material of the substrate.

21. The semiconductor fabrication system of claim 19, further comprising:

depositing the second dielectric material over the plane of fabrication of the substrate; and depositing the superconducting material over the second dielectric material, wherein the first depth and the second depth end in the second dielectric material without reaching the substrate.

22. The semiconductor fabrication system of claim 17, further comprising:

forming, using the superconducting material, a first coupling between the first film and the first contact; and forming, using the superconducting material, a second coupling between the second film and the second contact.

23. The semiconductor fabrication system of claim 17, further comprising:

depositing on the substrate, the superconducting material.

24. The semiconductor fabrication system of claim 17, wherein the superconducting material is Niobium (Nb) and the substrate comprises high-resistivity Silicon (Si).

* * * * *